(12) United States Patent
Li et al.

(10) Patent No.: US 11,435,411 B2
(45) Date of Patent: Sep. 6, 2022

(54) TIME DOMAIN DISTANCE PROTECTION BASED ON POLARITY COMPARISON FOR POWER TRANSMISSION LINES

(71) Applicant: Hitachi Energy Switzerland AG, Baden (CH)

(72) Inventors: YouYi Li, Västerås (SE); Jianping Wang, Västerås (SE); Aken-Kai Liu, Beijing (CN)

(73) Assignee: Hitachi Energy Switzerland AG, Baden (CH)

( * ) Notice: Subject to any disclaimer, the term of this patent is extended or adjusted under 35 U.S.C. 154(b) by 343 days.

(21) Appl. No.: 16/832,864

(22) Filed: Mar. 27, 2020

(65) Prior Publication Data
US 2020/0319262 A1 Oct. 8, 2020

(30) Foreign Application Priority Data
Apr. 8, 2019 (EP) .................................... 19167738

(51) Int. Cl.
*G01R 31/58* (2020.01)
*H02H 1/00* (2006.01)
*H02H 7/22* (2006.01)

(52) U.S. Cl.
CPC ........... *G01R 31/58* (2020.01); *H02H 1/0007* (2013.01); *H02H 7/226* (2013.01)

(58) Field of Classification Search
CPC ...... G01R 31/58; H02H 1/0007; H02H 3/405; H02H 7/226
USPC .......................................................... 361/86
See application file for complete search history.

(56) References Cited

U.S. PATENT DOCUMENTS

| 4,314,199 | A | 2/1982 | Yamaura et al. |
| 6,459,960 | B1 | 10/2002 | Shuto et al. |
| 2018/0069391 | A1* | 3/2018 | Liu ........................ H02H 7/263 |
| 2018/0292448 | A1 | 10/2018 | Schweitzer, III et al. |
| 2018/0301894 | A1* | 10/2018 | Ha ........................ G01R 31/085 |

FOREIGN PATENT DOCUMENTS

| CN | 104198884 B | 4/2015 |
| CN | 104659767 B | 5/2018 |
| CN | 105116295 B | 5/2018 |
| JP | 63124970 A | 5/1988 |
| WO | 9524014 A2 | 9/1995 |
| WO | 2007032697 A1 | 3/2007 |
| WO | 2017158608 A1 | 9/2017 |
| WO | 2018227466 A1 | 12/2018 |
| WO | WO-2018227466 A1 * | 12/2018 ........... G01R 31/085 |

\* cited by examiner

*Primary Examiner* — Kevin J Comber
(74) *Attorney, Agent, or Firm* — Slater Matsil, LLP (57) ABSTRACT

A method can be used for fault detection of a transmission. The method includes obtaining instantaneous measurements of local voltages and local currents of the transmission line, obtaining filtered measurements of the local voltages and local currents by subjecting the measurements of the local voltages and local currents to low pass filtering, obtaining a compensated voltage calculated by subjecting the filtered measurements to a differential equation based algorithm, and performing fault detection by forming a ratio between the compensated voltage and the a reference voltage. An internal fault is determined when the ratio is below a threshold and an external fault is determined when ratio is larger than above the threshold.

20 Claims, 12 Drawing Sheets

TIME DOMAIN DISTANCE PROTECTION BASED ON POLARITY COMPARISON FOR POWER TRANSMISSION LINES

CROSS-REFERENCE TO RELATED APPLICATIONS

This application claims priority to European Patent Application No. 19167738.4, filed on Apr. 8, 2019, which application is hereby incorporated herein by reference.

TECHNICAL FIELD

Embodiments presented herein relate to a method, a fault detection arrangement, a computer program, and a computer program product for fault detection of a transmission line.

BACKGROUND

In general terms, transmission line protection improves power system stability. In many instances, the performance of transmission line protection can be improved by increasing the speed of fault detection and fault clearing. If faults are not cleared before the critical fault clearing time, the power system may lose transient stability and possibly suffer a black out. In addition, faster fault clearing increases the amount of power that can be transferred. Faster protection also enhances public and utility personnel safety, limits equipment wear, improves power quality, and reduces property damage. Most protection principles of today are based on the fundamental frequency components of voltages and currents. Accurate measurement of a sinusoidal quantity typically takes a cycle of fundamental frequency in the given power system.

One advantage of time domain protection is that it can utilize more useful information from the voltage and current measurements of more frequencies instead of limited to fundamental frequency of 50/60 Hz.

Another advantage of time domain protection is that it is based on analyzing the samples themselves, which avoids the complex and tricky design of filters and Fast Fourier Transformation (FFT) processing, which is helpful to speed up the protection operation.

In some cases when there are some low frequency harmonics in transmission line system which are close to fundamental frequency, an FFT filter cannot remove such harmonics in a short data window (hence requiring a cycle or more).

Further, in some cases, if the fundamental frequency component is not the dominant component in the fault transient, it might be difficult to obtain a correct decision using classic phasor domain distance protection. This might not be the case for time domain protection schemes.

However there is still a need for improved time domain distance protection schemes.

SUMMARY

Embodiments disclosed herein provide a time domain distance protection scheme which does not suffer from the issues noted above or at least where these issues are reduced or mitigated.

According to a first aspect there is presented a method for fault detection of a transmission line. The method is performed by a fault detection arrangement. The method comprises obtaining instantaneous measurements of local voltages and local currents of the transmission line. The method comprises obtaining filtered measurements of the local voltages and local currents by subjecting the measurements of the local voltages and local currents to low pass filtering. The method comprises obtaining compensated voltage calculated by subjecting the filtered measurements to a differential equation based algorithm. The method comprises performing fault detection by forming a ratio between the compensated voltage and the filtered local voltage measurements. An internal fault is determined if the ratio is below a negative setting value as the threshold. Else, an external fault is determined.

According to a second aspect there is presented a fault detection arrangement for fault detection of a transmission line. The fault detection arrangement comprises processing circuitry. The processing circuitry is configured to cause the fault detection arrangement to obtain instantaneous measurements of local voltages and local currents of the transmission line. The processing circuitry is configured to cause the fault detection arrangement to obtain filtered measurements of the local voltages and local currents by subjecting the measurements of the local voltages and local currents to low pass filtering. The processing circuitry is configured to cause the fault detection arrangement to obtain compensated voltage calculated by subjecting the filtered measurements to a differential equation based algorithm. The processing circuitry is configured to cause the fault detection arrangement to perform fault detection by forming a ratio between the compensated voltage measurements and the filtered voltage measurements. An internal fault is determined if the ratio is below a negative setting value as the threshold. Otherwise, an external fault is determined.

According to a third aspect there is presented a computer program for fault detection of a transmission line, the computer program comprising computer program code which, when run on a fault detection arrangement according to the second aspect, causes the fault detection arrangement to perform a method according to the first aspect.

According to a fourth aspect there is presented a computer program product comprising a computer program according to the third aspect and a computer readable storage medium on which the computer program is stored. The computer readable storage medium could be a non-transitory computer readable storage medium.

Advantageously this provides efficient time domain distance protection of the transmission line that does not suffer from the issues noted above.

Advantageously, the proposed fault detection is fast and reliable.

Advantageously, the proposed fault detection enables quick and accurate tripping of internal faults.

Advantageously, the proposed fault detection avoids mal-operations for external faults.

Advantageously, the proposed fault detection enables handling of high SIR conditions with good sensitivity.

Advantageously, the proposed fault detection is based on full components instead of fault components, thereby, it can work continuously for fast relays (Zone 1) or backup relays (Zone 2/Zone 3) if needed. With the increasing use of power electronic devices in modern power systems, the protection principle based on the fault component (super-imposed components) might not work properly due to the linear system assumption for existing power systems. Advantageously, the proposed fault detection could be applied to non-linear systems too.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION OF ILLUSTRATIVE EMBODIMENTS

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
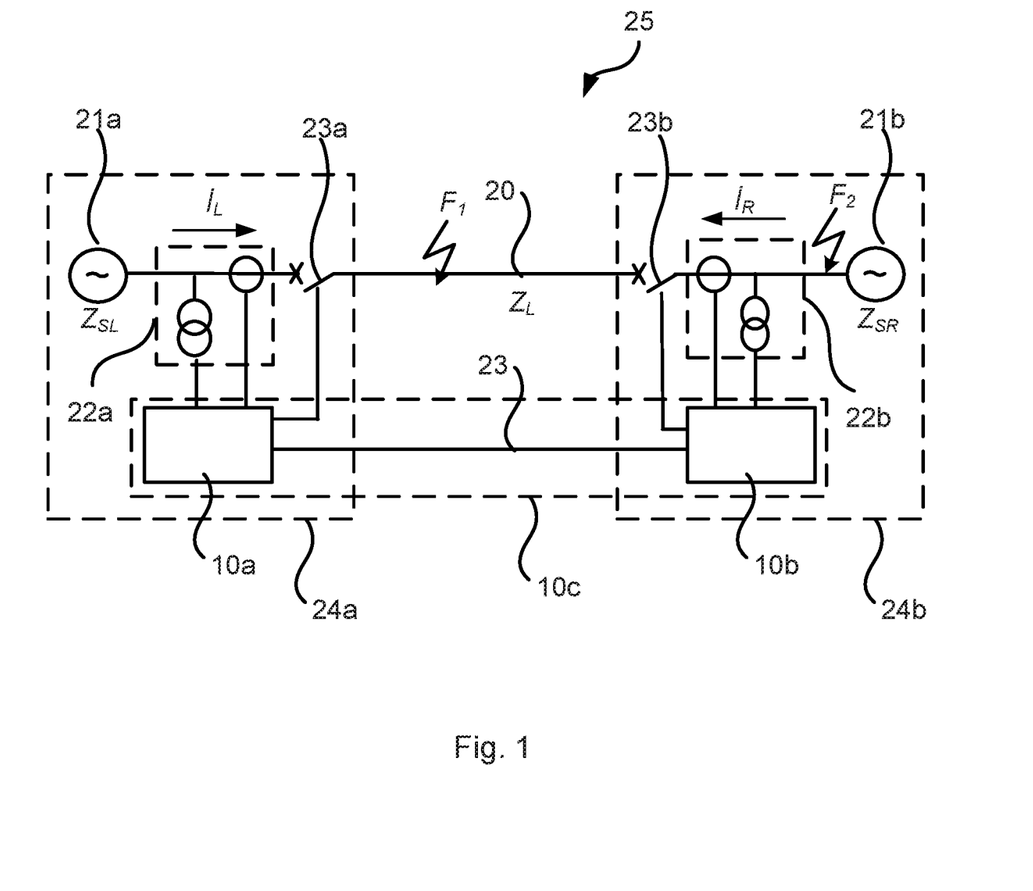
FIGS. 1, 2, 3 are schematic diagrams illustrating transmission systems according to embodiments.

FIG. 1 illustrates an example 500 kV transmission line system. The line length is for illustrative purposes assumed to be 230 km long. The sampling rate is 1 kHz for both current and voltage measurements. The reach setting of the proposed distance protection is 80% of the line (i.e., 184 km). The integration window is 20 ms. Only when more than 3 sample points in a row enter the operate zone, the proposed distance protection will release the trip signal.

In more detail, FIG. 1 schematically illustrates a transmission system 25 of a power distribution system where the herein disclosed embodiments apply. The transmission system 25 comprises at least one fault detection arrangement 10a, 10b for fault detection of a transmission line 20 of the transmission system 25. Two or more fault detection arrangements 10a, 10b may be operatively connected via a communications link 23 for pilot scheme, if needed. In theory, the communication link is not needed for distance protection including the proposed one. But in some cases, two or more distance protections can be connected with communication link or pilot scheme for better performance.

Further, two or more fault detection arrangements 10a, 10b may be part of a common fault detection arrangement 10c for fault detection of the transmission line 20. The fault detection arrangement 10a, 10b, 10c may be part of, or comprise, an intelligent electronic device (IED) operating as a relay. The transmission system 25 further comprises power sources 21a, 21b, current and voltage transformers 22a, 22b, and circuit breakers 23a, 23b. F1 and F2 denote internal and external faults, respective, along the transmission line 20. The transmission line 20 might be an ultrahigh voltage (UHV) transmission line 20. The transmission line 20 might be part of a power distribution system.

Figure 2:
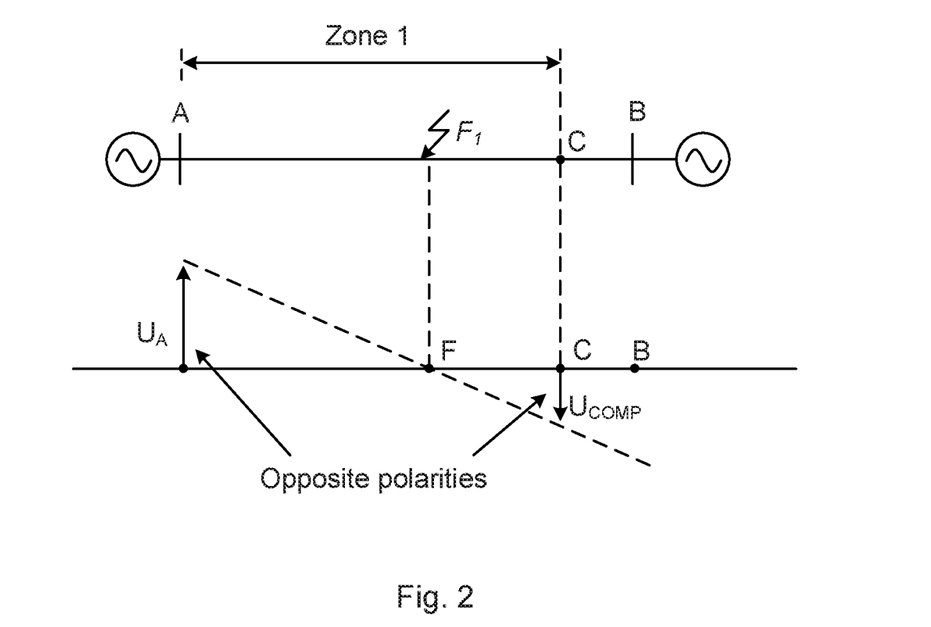
Figure 3:
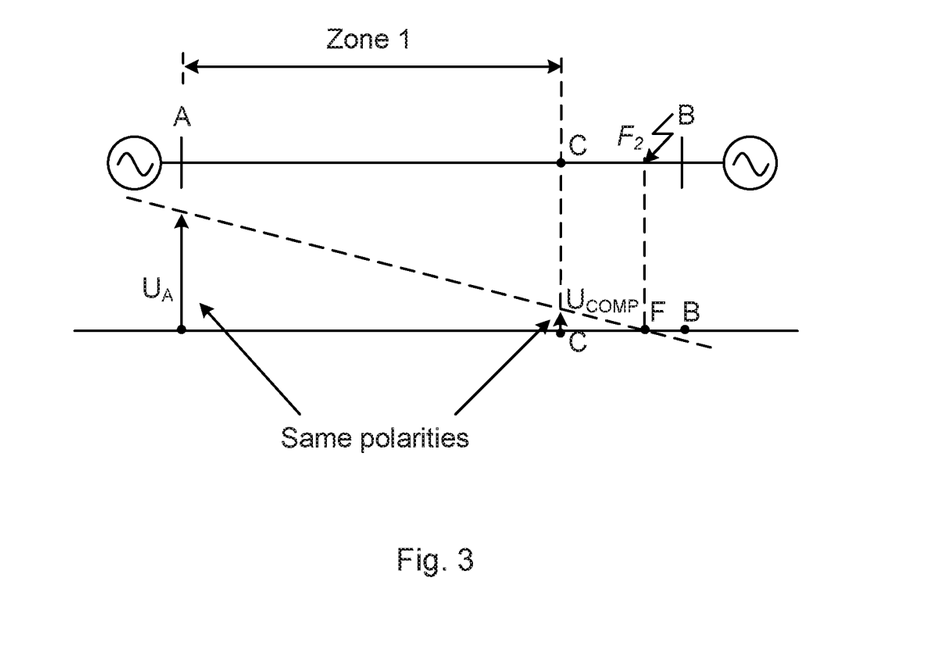

FIG. 2 schematically illustrates a simplified example of the transmission system 25 of FIG. 1 with an internal fault occurring at point F1. FIG. 3 schematically illustrates a simplified example of the transmission system 25 of FIG. 1 with an external fault occurring at point F2.

The embodiments disclosed herein relate to mechanisms for fault detection of the transmission line 20 of the transmission system 25. In order to obtain such mechanisms, there is provided a fault detection arrangement 10a, 10b, 10c, methods performed by the fault detection arrangement 10a, 10b, 10c, a computer program product comprising code, for example in the form of a computer program, that when run on a fault detection arrangement 10a, 10b, 10c, causes the fault detection arrangement 10a, 10b, 10c to perform the method.

Time domain protection based on the polarity information of full component compensated voltage at the reach point is proposed in order to correctly identify internal faults and external faults.

According to the proposed time domain protection scheme, an internal fault is detected by comparing the polarities of compensated voltage at the reach point with a reference voltage (e.g., a local voltage). As shown in FIGS. 2 and 3, the polarities are the opposite for internal faults (F1 fault as in FIG. 2) and the same for external faults (F2 fault as in FIG. 3).

In theory, the principle shown in FIGS. 2 and 3 is valid for every sampling point in the time domain. Furthermore, the principle is valid no matter if the source voltage is a pure fundamental sine wave or any other wave shapes. This is helpful for the operational speed and security of the protection scheme.

It is acknowledged that there might be some measurement errors, parameter errors, calculation errors, etc. or other types of errors in certain practical applications. The herein disclosed methods are designed to consider such errors, making the methods robust and reliable.

Figure 4:
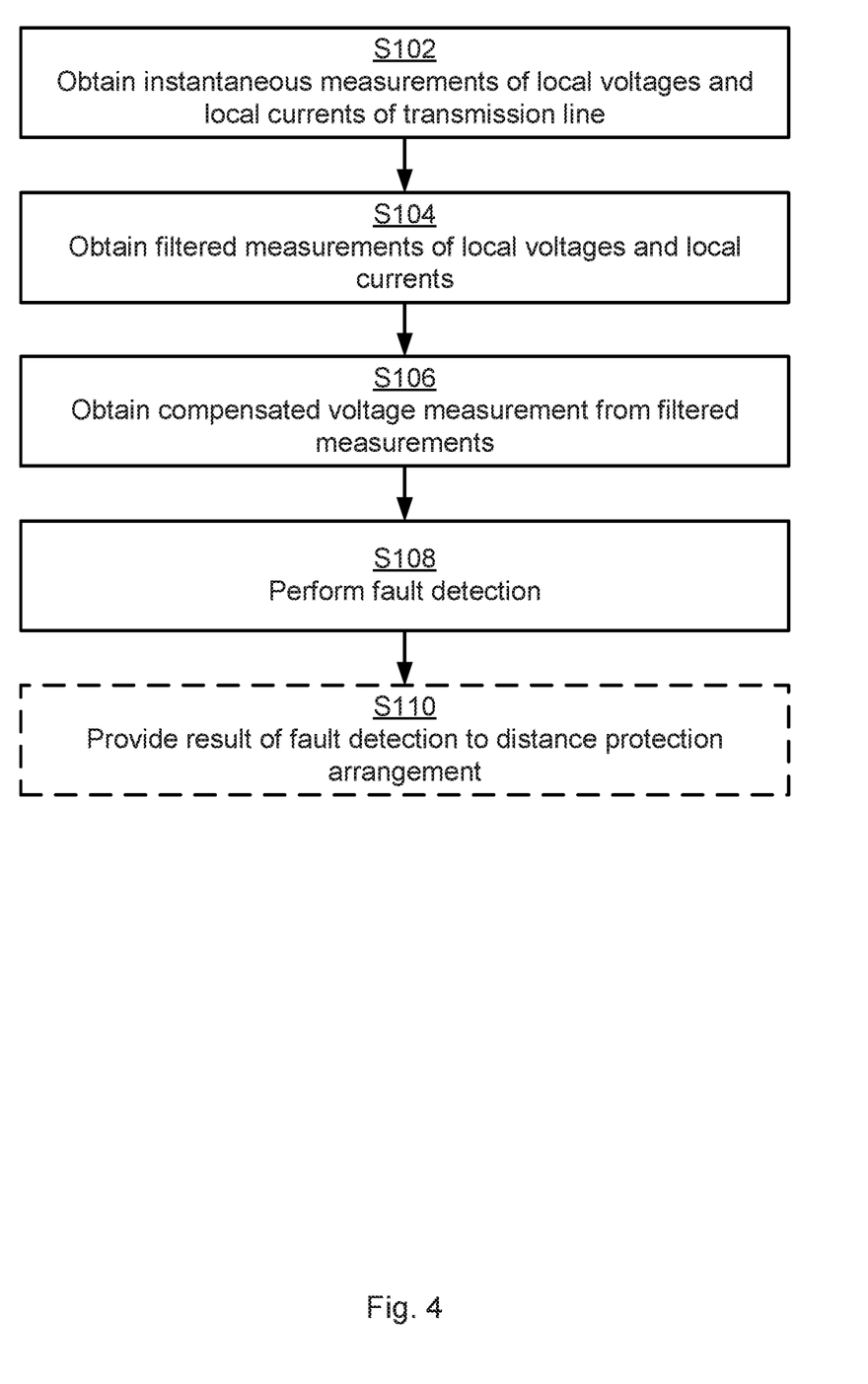
FIG. 4 is a flowchart of methods according to embodiments.

Methods for fault detection of a transmission line will now be disclosed with reference to the flowchart of FIG. 4. The methods are performed by a fault detection arrangement 10a, 10b, 10c.

S102: Instantaneous measurements of the local voltages and local currents are obtained. For the voltages this corresponds to measurements of $U_A$ in FIGS. 2 and 3.

S104: Filtered measurements are obtained by subjecting the measurements of the local voltages and local currents to low pass filtering. The cut off frequency of the low pass filter used for the low pass filtering depends on the consideration of different factors, such as the parameters of current transforms (CTs) and capacitor voltage transformers (CVTs), measurement sampling rate of the protection relay, etc. For the voltages this corresponds to measurements of $V_{ref}$ below. For example, the cutoff frequency can be on the order of several kHz, e.g., 1 to 5 kHz.

S106: Compensated voltage measurements are obtained by subjecting the filtered measurements of the local voltages and local currents to a differential equation based algorithm. For the voltages this corresponds to measurements of $U_{comp}$ in FIGS. 2 and 3.

In some aspects the transmission line is assumed to be represented by a resistor—inductor circuit (RL circuit) and the differential equation based algorithm is thus an RL based differential equation based algorithm. In other aspects the transmission line is assumed to be represented by a resistor—inductor—capacitor circuit (RLC circuit) in case of series compensation capacitors are included in the transmission line and the differential equation based algorithm is thus an RLC based differential equation based algorithm.

S108: Fault detection is performed by forming a ratio between the compensated voltage measurements and the filtered voltage measurements.

In some aspects the ratio is formed from measurements collected during a time window. For examples, the time window could be 10 ms or 20 ms long.

In some aspects the ratio is determined as a normalized convolution between the compensated measurements and the filtered measurements.

An internal fault is determined if the ratio is below a negative threshold. This corresponds to the situation in FIG. 2. Else, an external fault is determined. This corresponds to the situation in FIG. 3. In some aspects the threshold is set to zero. In other aspects the threshold is set to a negative value close to zero. For examples, the threshold could be set to −0.2.

The above steps are performed for each of three phases.

The above steps are performed for both phase-to-phase measurements and phase-to-ground measurements of the local voltage.

The above steps of obtaining instantaneous measurements and obtaining filtered measurements could also be performed for instantaneous measurements of the local current in each of the three phases and for both phase-to-phase measurements and phase-to-ground measurements of the local current. The compensated measurements (of the local voltage) could then be dependent also on the filtered measurements of the local current in each of the three phases and for both phase-to-phase measurements and phase-to-ground measurements.

S110: In some aspects a result of the fault detection (i.e., if an internal fault was detected or an external fault was detected) is provided to a distance protection arrangement for making a trip decision. A trip is then only triggered if the detected fault is an internal fault. That is, the result causes a trip of a circuit breaker 23a, 23b of the distance protection arrangement to be triggered only if the detected fault is an internal fault.

Further details of fault detection of a transmission line 20 will now be disclosed.

As noted above, three actions, might be performed during the fault detection once the instantaneous measurements have been obtained (as in S102): application of low pass filtering (as in S104), running of a differential equation based algorithm (as in S106), and performing voltage comparison (as in S108). Aspects of S104-S108 will now be disclosed in further detail.

First, high frequency noise is removed by low pass filtering of the measurements of the local measurements (voltages as well as currents). In this respect, low pass filtering can be used to decrease the influence of high frequency noise (since the differential equation based algorithm as used thereafter might be sensitive to high frequency noise or error).

The output filtered measurements (voltages as well as currents) of the low pass filtering is used as input to the differential equation based algorithm whereby compensated voltage measurements are obtained.

The compensated voltage in the time domain at the reach point is calculated by means of a differential equation based algorithm. This calculation is valid for any frequency component or any wave shape (in theory). Two examples of a differential equation based algorithm have been mentioned above for a transmission line with typical RL circuits represented as series line parameters and for series compensated transmission line with series capacitors included in the series line parameters as RLC circuits.

Assuming the symbol $\varphi$ is used to represent any phase A, B, C of a three phase transmission system and the symbol $\varphi\varphi$ is used to represent any phase to phase of three phase transmission systems, the following definitions could be given:

$Uq_{\varphi\varphi}$ is the compensated voltage for the phase-to-phase loop $Uq_\varphi$ is the compensated voltage for the phase-to-ground loop $u_{\varphi\varphi}$ is the local phase to phase loop voltage $u_\varphi$ is the local phase voltage $i_{\varphi\varphi}$ is the local phase to phase current $i_\varphi$ is the local phase current $i_0$ is the local zero sequence current $R_0$ is the line zero sequence resistance $R_1$ is the line positive sequence resistance $L_0$ is the zero sequence inductance $L_1$ is the line positive sequence inductance $u_{SC\varphi\varphi}$ is the phase to phase voltage across the series compensation capacitor circuits, and $u_{SC\varphi}$ is the one phase voltage across the series compensated capacitor circuit.

For the normal transmission line with series line parameters as RL circuits, the compensated voltage of phase-to-phase loop $Uq_{\varphi\varphi}$ and the compensated voltage of phase-ground loop $Uq_\varphi$ are determined as follows respectively:

$$Uq_{\varphi\varphi} = u_{\varphi\varphi} - i_{\varphi\varphi} \cdot R_1 - L_1 \frac{di_{\varphi\varphi}}{dt}, \text{ and}$$

$$Uq_\varphi = u_\varphi - \left((i_\varphi + k_R 3i_0) \cdot R_1 + L_1 \frac{d}{dt}(i_\varphi + k_L 3i_0)\right), \text{ where}$$

$$k_R = \frac{R_0 - R_1}{3R_1}, k_L = \frac{L_0 - L_1}{3L_1} = \frac{X_0 - X_1}{3X_1}.$$

For the series compensated line with series line parameters as RLC circuits, the compensated voltage of phase-to-phase loop $Uq_{\varphi\varphi}$ and the compensated voltage of phase-ground loop $Uq_\varphi$ are determined as follows:

$$Uq_{\varphi\varphi} = u_{\varphi\varphi} - i_{\varphi\varphi} \cdot R_1 - L_1 \frac{di_{\varphi\varphi}}{dt} - u_{SC\varphi\varphi}, \text{ and}$$

$$Uq_\varphi = u_\varphi - \left((i_\varphi + k_R 3i_0) \cdot R_1 + L_1 \frac{d}{dt}(i_\varphi + k_L 3i_0)\right) - u_{SC\varphi}, \text{ where}$$

$$k_R = \frac{R_0 - R_1}{3R_1}, k_L = \frac{L_0 - L_1}{3L_1} = \frac{X_0 - X_1}{3X_1}.$$

The output of the differential equation based algorithm is used as input to the fault detection. As disclosed above, in some aspects a comparison of voltage polarities is performed in terms of a normalized convolution. The normalized convolution between two general voltage values $v_1(t)$ and $v_2(t)$ can be expressed as follows:

$$s = \frac{\int v_1(t) \cdot v_2(t) dt}{\int |v_1(t) \cdot v_2(t)| dt}$$

Here, $v_1(t)$ and $v_2(t)$ are replaced by values of the compensated measurements and local measurement with the filtered measurements for each phase A, B, C. For example, for one phase loop, $v_1(t)$ could be the local voltage $u_\varphi(t)$ and $v_2(t)$ could be $Uq_\varphi(t)$; for one of phase to phase loop, $v_1(t)$ could be the local voltage $u_{\varphi\varphi}(t)$ and $v_2(t)$ could be $Uq_{\varphi\varphi}(t)$.

Although the polarity criterion for internal fault detection in theory is valid for every sampling value, in practice this condition might not be ideal because of measurement errors, calculation errors, etc. Therefore, a normalized convolution might be used to compare the voltage polarities of compensated voltage and reference voltage (e.g., local voltage) for increasing reliability and robustness. The integration window length might depend on system conditions. A short integration window (e.g., 10 ms) could be used, which is beneficial to the sensitivity and speed. In case more serious fault transients (e.g., compensated line) or oscillations occur, a longer integration window (e.g., 20 ms) could be used, which is beneficial to the security and reliability.

In theory, the ratio should be positive for an external fault and negative for an internal fault. In theory, the value zero could therefore be used as the threshold in the criterion for detecting an internal fault. But considering the reliability and errors that might occur in practical applications, a negative setting value (e.g., −0.2) could be used as the threshold to detect the internal fault. Only when the calculated ratio 's' is below the threshold (e.g., −0.2), an internal fault will be detected.

To further enhance the security and reliability, a startup element could be used to open the trip window for some time (e.g., 20 ms). Otherwise, if the startup element does not operate, the final trip signal will be blocked even when the method indicates an internal fault.

The proposed method is based on polarity comparison of voltages, which is not sensitive to voltage amplitude. As a result, it can handle high source impedance ratio (SIR) conditions, while existing time domain protection methods based on amplitude may have weak sensitivity under high SIR conditions.

The proposed method is suitable for both normal power lines and series compensated lines.

The proposed method can work continuously because it is based on full components instead of fault component values.

Simulation results will be disclosed next.

Simulation results for an internal fault will now be disclosed.

Figure 5:
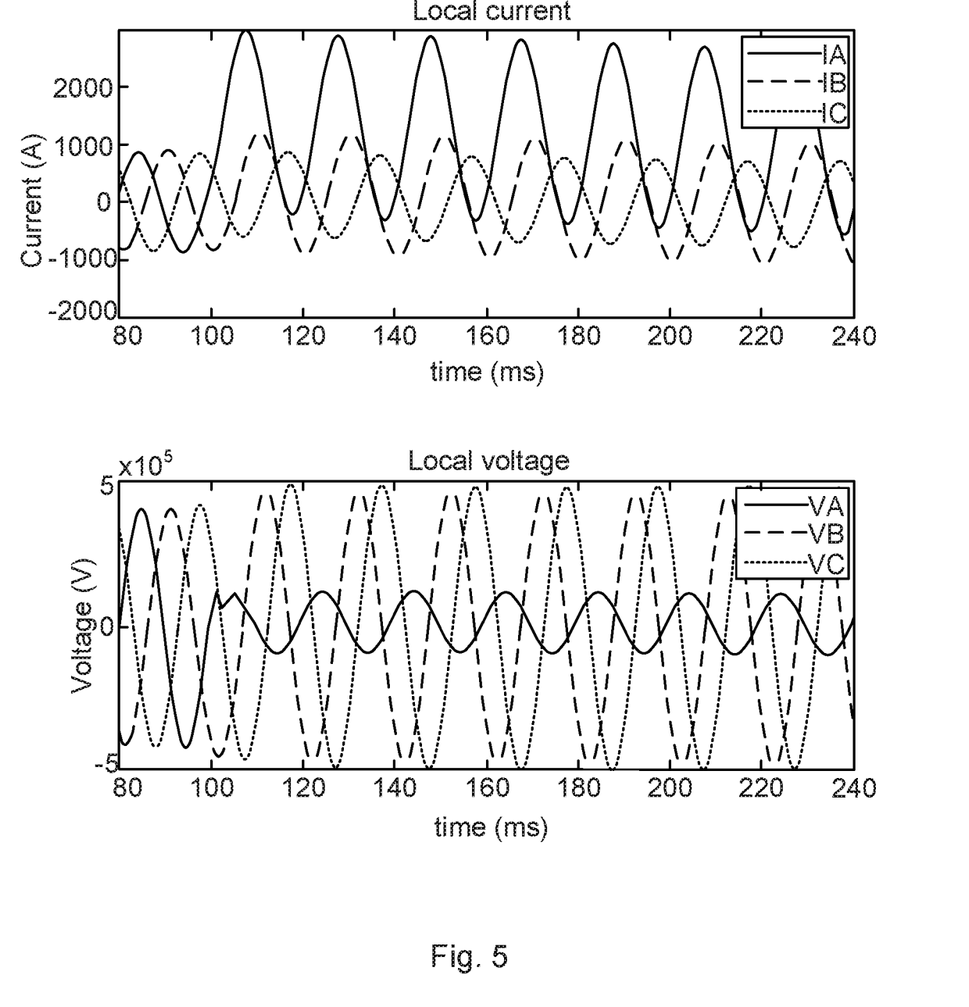
FIGS. 5, 6, 7, 8, 10, 11, 12 illustrate measured electrical signal values and calculated values according to embodiments.

An internal phase-to-ground fault (F1 in FIG. 1) for phase A is assumed to occur at 100 ms and be located at the midpoint of the line (i.e., 115 km). The power load angle is 30 degrees and source impedance to line impedance ratio (SIR) is set to SIR=3 in this case. The measurements of this simulation case are shown in FIG. 5.

Figure 6:
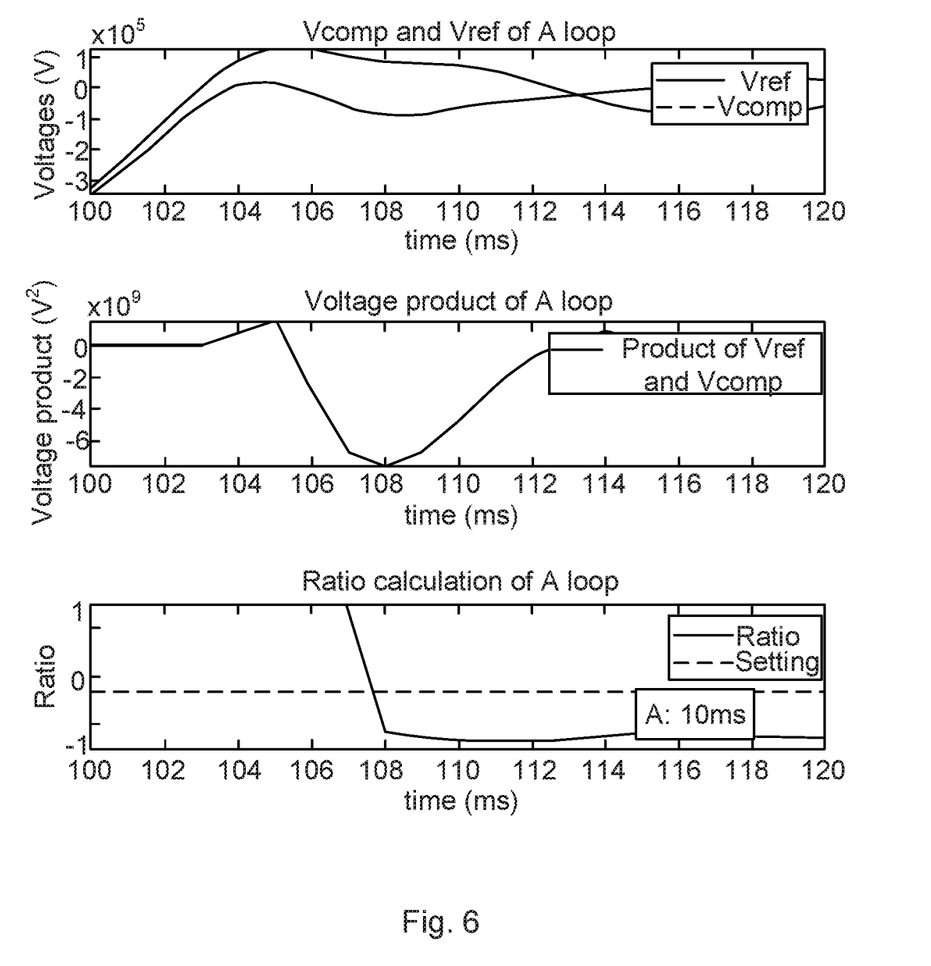
Figure 7:
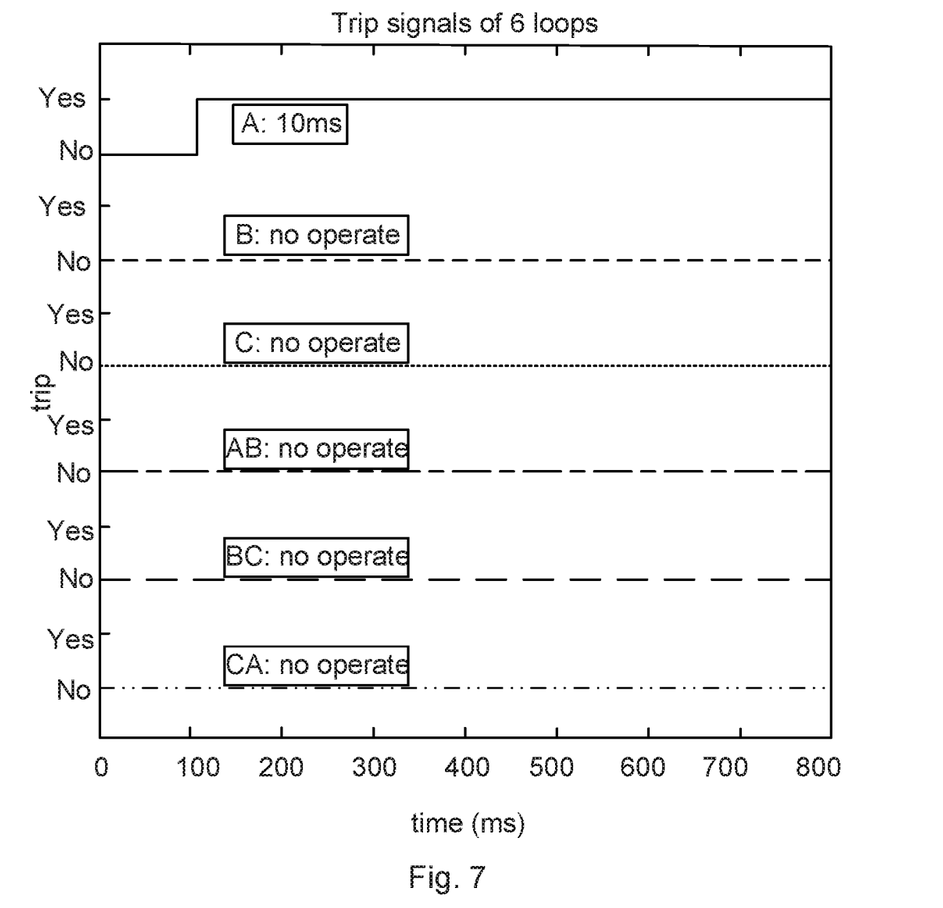

There are 6 loops (3 phase-to-phase loops and 3 phase-to-ground loops). The calculation of compensated voltage (at 80% of the line) and related polarity comparison of the phase A to ground loop is shown in FIG. 6. The remaining other 5 loops are assumed to remain stable (i.e., no trip) in this simulation case. According to FIG. 6, for the phase A to ground loop the operate value of the ratio 's' enters the "operate" zone, meaning that a signal is issued to the circuit breaker to trip, at 8 ms after the fault occurs and thus the herein disclosed methods detect an internal fault of the phase A to ground loop at 10 ms, after 3 points of confirmation. As mentioned above, the remaining other 5 loops are assumed to remain stable and hence an external fault with very large security margin (s=1) is indicated for these loops and they stay in the "no operate" zone, meaning that they do not issue any signal to the circuit breaker to trip. The "operate" and "no operate" results are correct, fast and secure. The final trip signals of the 6 loops are shown in FIG. 7.

Simulation results for an external fault will now be disclosed.

Figure 8:
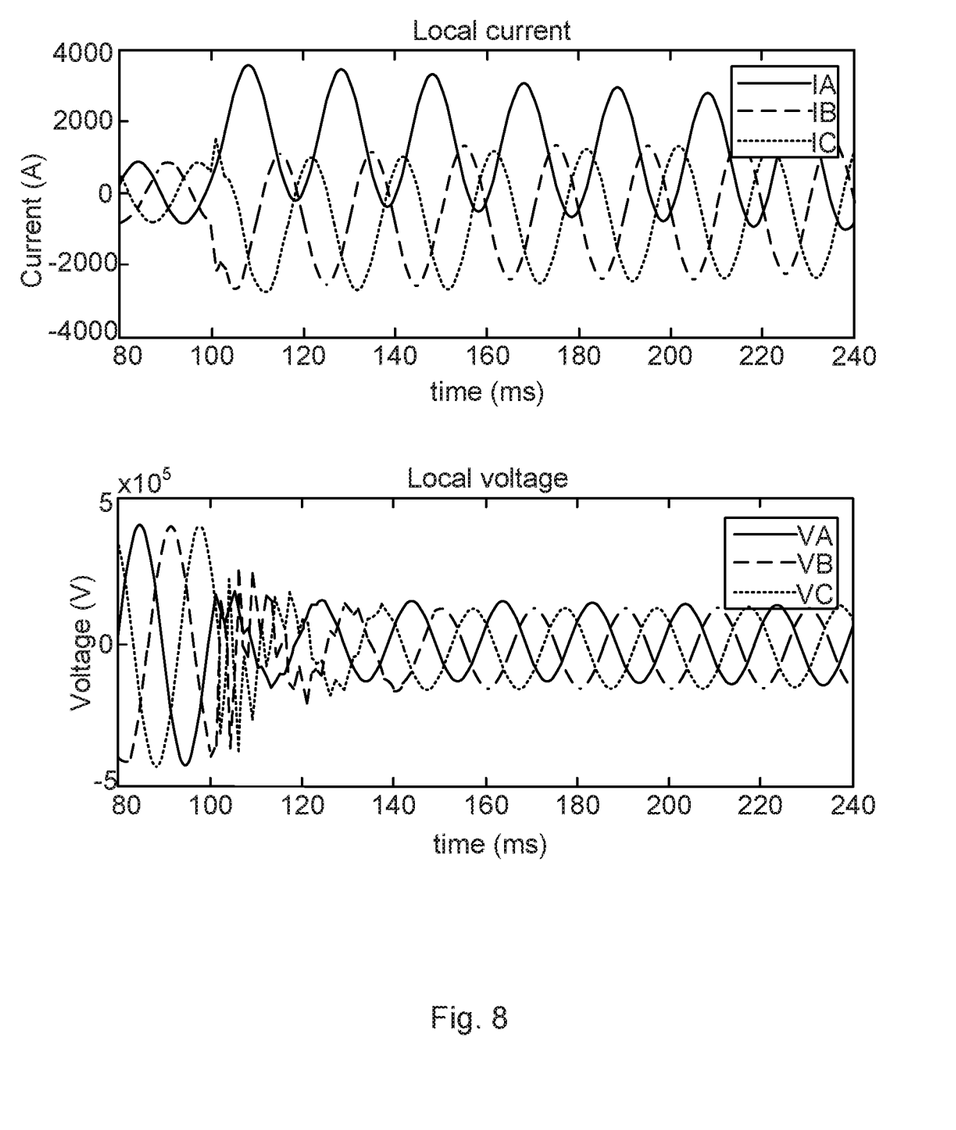

An external phase-to-phase solid fault between phase A and phases B, C (F2 in FIG. 1) is assumed to occur at 100 ms and be located at the remote busbar (230 km). The power angle is 30 degrees and SIR=3 in this case. The measurements of this simulation case are shown in FIG. 8.

Figure 9:
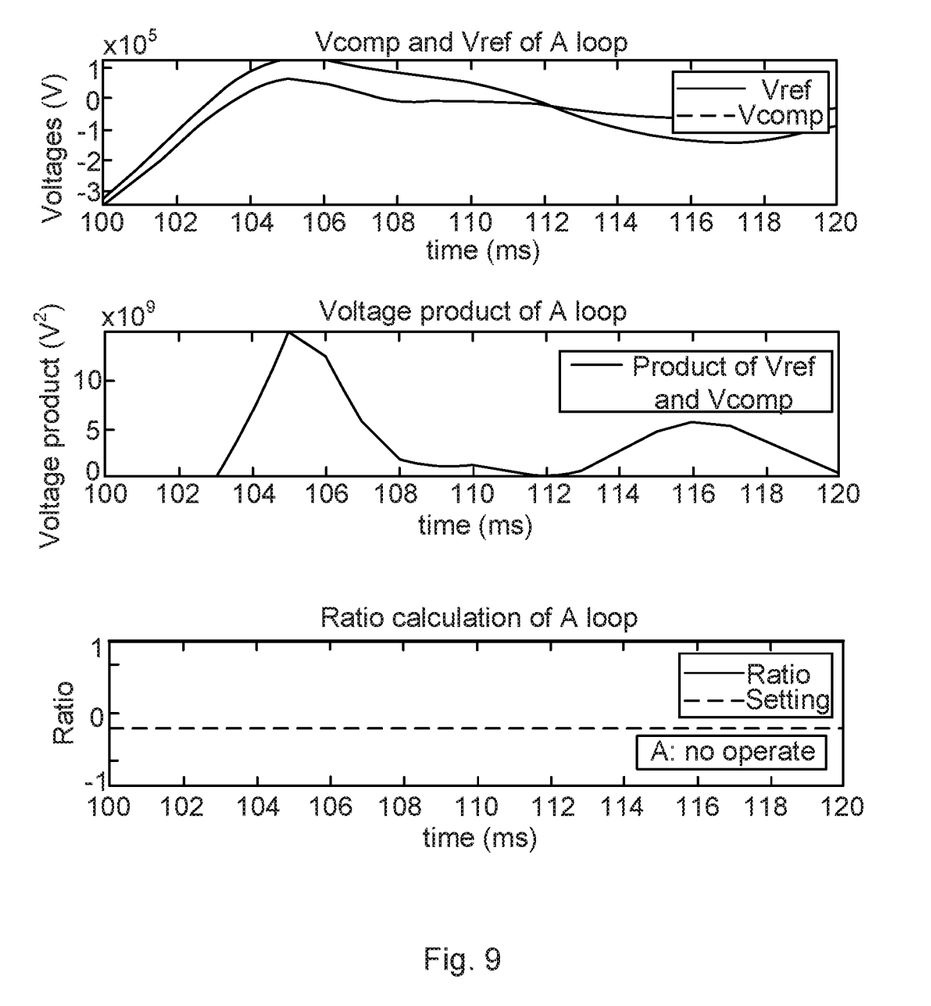

All the 6 loops remain stable in this case. As an example, the calculation of compensated voltage (at 80% of the line) and related polarity comparison results for the phase A to ground loop is shown in FIG. 9. An external fault is detected with large security margin (s=1) and the loop stays in the "no operate" zone.

Figure 10:
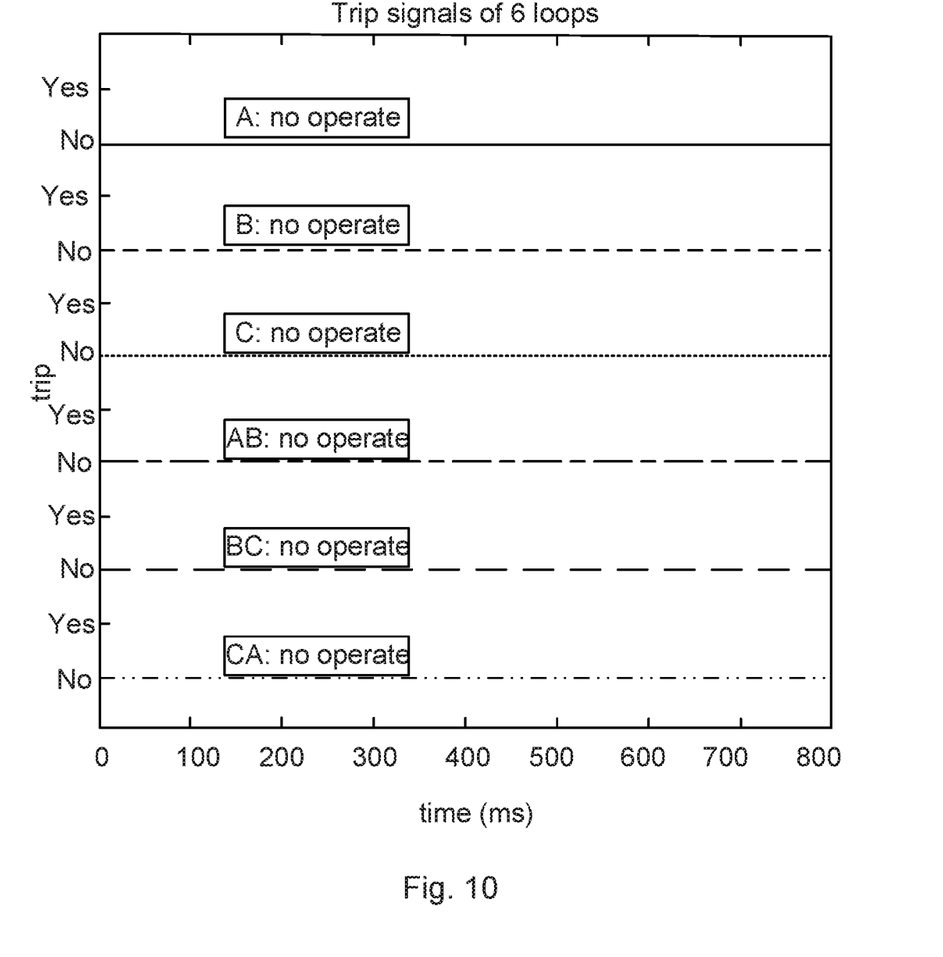

The final trip signals of the 6 loops are shown in FIG. 10. The "no operate" results are correct and secure.

Further aspects of scenarios of high SIR will now be disclosed.

Most traditional time domain distance protection schemes based on amplitude comparison have an issue with low sensitivity for high SIR conditions. However, since the proposed polarity detection scheme does not need high amplitude to work correctly, the proposed polarity comparison based distance protection scheme has relatively high sensitivity even for high SIR conditions.

Figure 11:
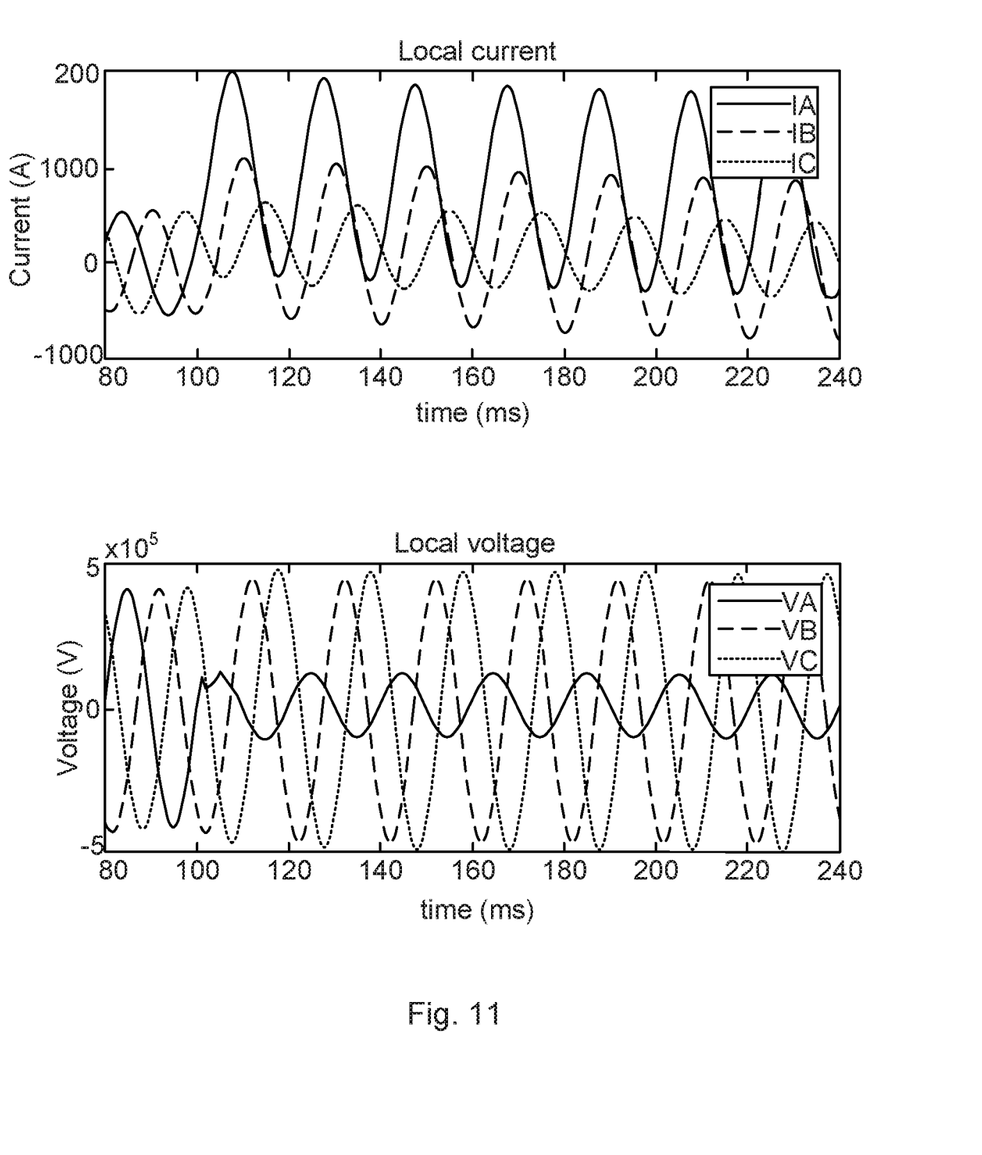

One example with a high SIR is shown in FIG. 11. The line length is 230 km and the system model is shown in FIG. 1. In this case, SIR=6 which means the positive source impedance is up to about 350Ω. A phase-to-ground fault for phase A occurs at 70% of the protected line. The reach setting of proposed distance protection is 80% of the line. The voltage and current measurements are shown in FIG. 11 and the characteristics and operate results of proposed distance protection are shown in FIG. 12.

Figure 12:
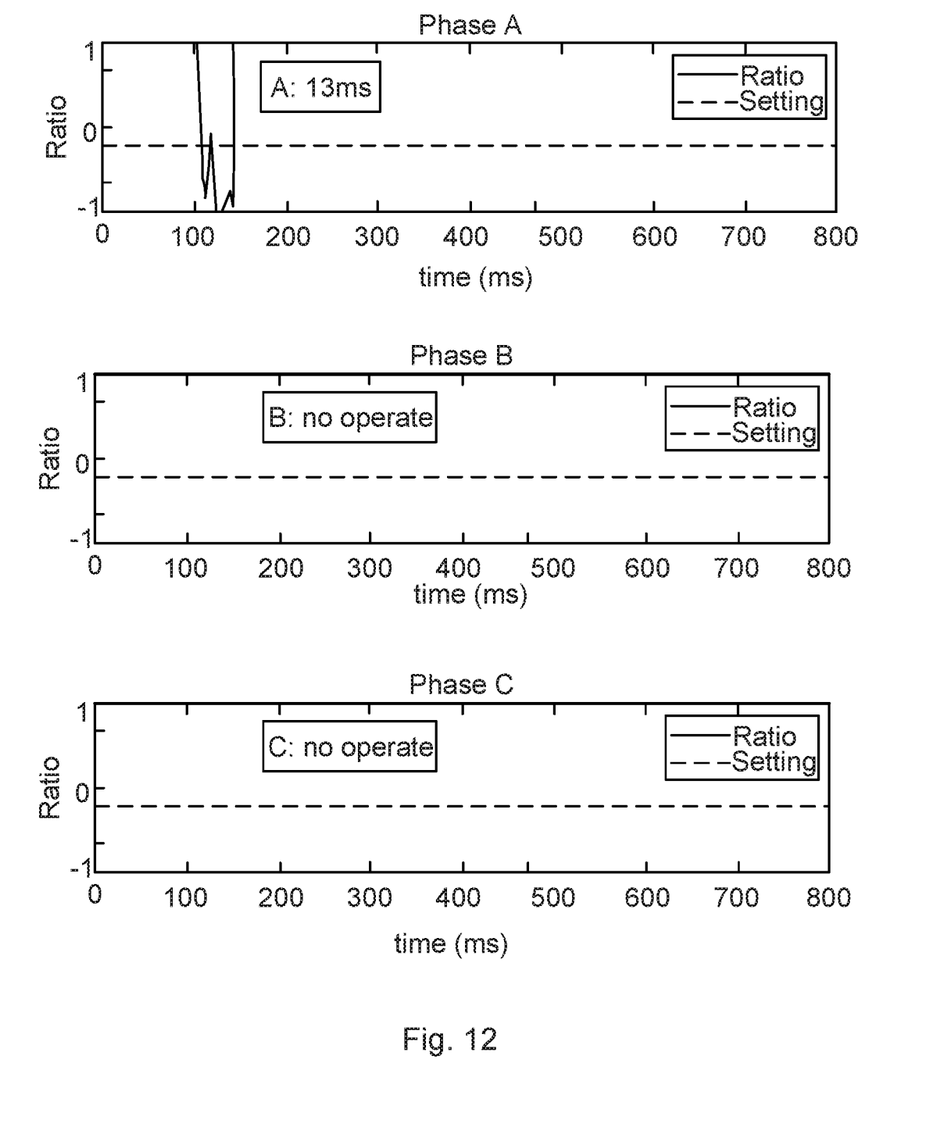

As shown in FIGS. 11 and 12, the proposed distance protection scheme operates correctly. More simulation results with different SIR conditions are shown in Table 1. All the cases in the table are remote faults, where the fault points are located at 70% of the 230 km length line and the proposed distance protection is set to cover 80% of the line.

TABLE 1

Operate time of remote faults (70%) with different SIR values

| SIR | 0.2 | 0.5 | 1 | 2 | 3 | 4 | 5 | 6 | 7 | 8 | 9 | 10 | 15 | 20 |
|---|---|---|---|---|---|---|---|---|---|---|---|---|---|---|
| Operate time (ms) | 10 | 10 | 11 | 11 | 12 | 12 | 12 | 13 | 13 | 13 | 13 | 13 | 15 | 16 |

As shown in Table 1, the proposed distance protection scheme is able to handle extreme case even when SIR=20. In addition, the operate time of the proposed distance protection is quite stable for different SIR conditions (from 10 ms to 16 ms) besides high sensitivity.

The results have shown that the proposed distance protection has very high sensitivity to handle high SIR scenarios. This is an advantage since existing time domain distance protection schemes based on amplitude may fail to operate under such high SIR scenarios.

Figure 13:
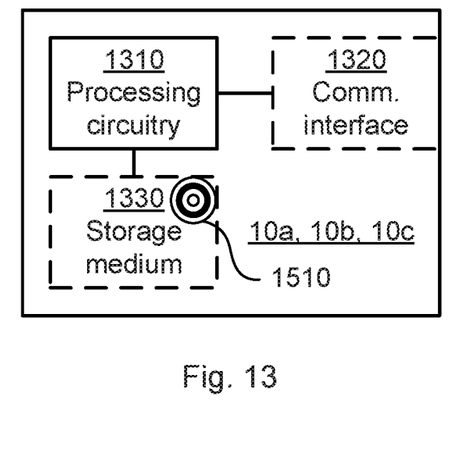
FIG. 13 is a schematic diagram showing functional units of a fault detection arrangement according to an embodiment.

FIG. 13 schematically illustrates, in terms of a number of functional units, the components of a fault detection arrangement 10a, 10b, 10c for fault detection of the transmission line 20 of the transmission system 25 according to an embodiment. Processing circuitry 1310 is provided using any combination of one or more of a suitable central processing unit (CPU), multiprocessor, microcontroller, digital signal processor (DSP), etc., capable of executing software instructions stored in a computer program product 1510 (as in FIG. 15), e.g., in the form of a storage medium 1330. The processing circuitry 1310 may further be provided as at least one application specific integrated circuit (ASIC), or field programmable gate array (FPGA).

Particularly, the processing circuitry 1310 is configured to cause the fault detection arrangement 10a, 10b, 10c to perform a set of operations, or steps, as disclosed above. For example, the storage medium 1330 may store the set of operations, and the processing circuitry 1310 may be configured to retrieve the set of operations from the storage medium 1330 to cause the fault detection arrangement 10a, 10b, 10c to perform the set of operations. The set of operations may be provided as a set of executable instructions.

Thus the processing circuitry 1310 is thereby arranged to execute methods as herein disclosed. The storage medium 1330 may also comprise persistent storage, which, for example, can be any single one or combination of magnetic memory, optical memory, solid state memory or even remotely mounted memory. The fault detection arrangement 10a, 10b, 10c may further comprise a communications interface 1320 at least configured for obtaining current values from the transmission system 25, to provide current values to the distance protection fault detection arrangement 1210, and for communications with another fault detection arrangement 10a, 10b, 10c. As such the communications interface 1320 may comprise one or more transmitters and receivers, comprising analogue and digital components. The processing circuitry 1310 controls the general operation of the fault detection arrangement 10a, 10b, 10c, e.g., by sending data and control signals to the communications interface 1320 and the storage medium 1330, by receiving data and reports from the communications interface 1320, and by retrieving data and instructions from the storage medium 1330. Other components, as well as the related functionality, of the fault detection arrangement 10a, 10b, 10c are omitted in order not to obscure the concepts presented herein.

Figure 14:
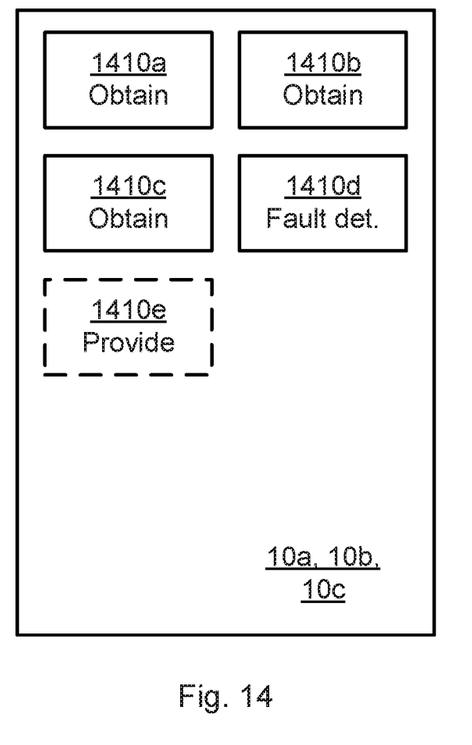
FIG. 14 is a schematic diagram showing functional modules of a fault detection arrangement according to an embodiment.

FIG. 14 schematically illustrates, in terms of a number of functional modules, the components of a fault detection arrangement 10a, 10b, 10c for distance protection of the transmission line 20 of the transmission system 25 according to an embodiment. The fault detection arrangement 10a, 10b, 10c of FIG. 14 comprises a number of functional modules; an obtain module 1410a configured to perform step S102, an obtain module 1410b configured to perform step S104, an obtain module 1410c configured to perform step S106, and a fault detection module 1410d configured to perform step S108.

The fault detection arrangement 10a, 10b, 10c of FIG. 14 may further comprise a number of optional functional modules, such as a provide module 1410e configured to perform step S110. In general terms, each functional module 1410a-1410e may in one embodiment be implemented only in hardware and in another embodiment with the help of software, i.e., the latter embodiment having computer program instructions stored on the storage medium 1330 which when run on the processing circuitry makes the fault detection arrangement 10a, 10b, 10c perform the corresponding steps mentioned above in conjunction with FIG. 4. It should also be mentioned that even though the modules correspond to parts of a computer program, they do not need to be separate modules therein, but the way in which they are implemented in software is dependent on the programming language used. Preferably, one or more or all functional modules 1410a-1410e may be implemented by the processing circuitry 1310, possibly in cooperation with the communications interface 1320 and/or the storage medium 1330. The processing circuitry 1310 may thus be configured to from the storage medium 1330 fetch instructions as provided by a functional module 1410a-1410e and to execute these instructions, thereby performing any steps as disclosed herein.

Figure 15:
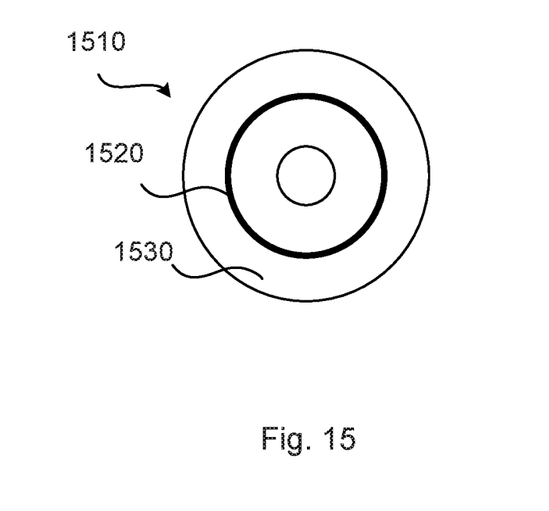
FIG. 15 shows one example of a computer program product comprising computer readable storage medium according to an embodiment.

FIG. 15 shows one example of a computer program product 1510 comprising computer readable storage medium 1530. On this computer readable storage medium 1530, a computer program 1520 can be stored, which computer program 1520 can cause the processing circuitry 1310 and thereto operatively coupled entities and devices, such as the communications interface 1320 and the storage medium 1330, to execute methods according to embodiments described herein. The computer program 1520 and/or computer program product 1510 may thus provide means for performing any steps as herein disclosed.

In the example of FIG. 15, the computer program product 1510 is illustrated as an optical disc, such as a CD (compact disc) or a DVD (digital versatile disc) or a Blu-Ray disc. The computer program product 1510 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1520 is here schematically shown as a track on the depicted optical disk, the computer program 1520 can be stored in any way which is suitable for the computer program product 1510.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

What is claimed is:

1. A method for fault detection of a transmission line, the method comprising:
obtaining instantaneous measurements of local voltages and local currents of the transmission line;
obtaining filtered measurements of the local voltages and local currents by subjecting the measurements of the local voltages and local currents to low pass filtering;

obtaining a compensated voltage calculated by subjecting the filtered measurements to a differential equation based algorithm; and performing fault detection by forming a ratio between the compensated voltage and a reference voltage, wherein an internal fault is determined when the ratio is below a threshold and an external fault is determined when ratio is above the threshold.

2. The method according to claim 1, wherein the method is performed for each of three voltage phases.

3. The method according to claim 1, wherein the method is performed for both phase-to-phase measurements and phase-to-ground measurements of the local voltages and currents.

4. The method according to claim 1, further comprising providing a result of the fault detection to a distance protection arrangement for making a trip decision.

5. The method according to claim 4, wherein the result causes a trip of a circuit breaker of the distance protection arrangement to be triggered only if the detected fault is an internal fault.

6. The method according to claim 1, wherein the low pass filter used for the low pass filtering has a cutoff frequency between 1 and 5 kHz.

7. The method according to claim 1, wherein the transmission line is represented by a resistor-inductor (RL) circuit and the differential equation based algorithm is an RL based differential equation based algorithm.

8. The method according to claim 1, wherein the transmission line is represented by a resistor-inductor-capacitor in series for series capacitor compensated transmission lines (RLC) circuit and the differential equation based algorithm is an RLC based differential equation based algorithm.

9. The method according to claim 1, wherein the ratio is determined as a normalized convolution between the compensated voltage and the reference voltage.

10. The method according to claim 1, wherein the ratio is formed from measurements collected during a time window.

11. The method according to claim 1, wherein the threshold is set to zero.

12. The method according to claim 1, wherein the threshold is set to −0.2.

13. The method according to claim 1, wherein the transmission line is an ultra high voltage (UHV) transmission line.

14. A method of operating a transmission line, the method comprising:
measuring local voltages and local currents of the transmission line to obtain instantaneous measurements of local voltages and local currents;
low pass filtering the measurements of the local voltages and local currents to obtain filtered measurements of the local voltages and local currents;
subjecting the filtered measurements to a differential equation based algorithm to obtain compensated voltage values;
performing fault detection by forming a ratio between the compensated voltage and a reference voltage, wherein an internal fault is determined when the ratio is below a threshold and an external fault is determined when the ratio is greater than the threshold; and
providing a result of the fault detection to a distance protection arrangement for making a trip decision.

15. The method according to claim 14, wherein the result causes a trip of a circuit breaker of the distance protection arrangement to be triggered only if the detected fault is an internal fault.

16. A fault detection apparatus for a transmission line, the fault detection apparatus comprising:
processing circuitry;
a memory coupled to the processing circuitry, the memory storing a computer program comprising computer code that, when run on the processing circuitry, causes the fault detection apparatus to:
obtain instantaneous measurements of local voltages and local currents of the transmission line;
obtain filtered measurements of the local voltages and currents by subjecting the measurements of the local voltages and local currents to low pass filtering;
obtain a compensated voltage measurement by subjecting the filtered measurements to a differential equation based algorithm; and
perform fault detection by forming a ratio between the compensated voltage and a reference voltage, wherein an internal fault is determined when the ratio is below a threshold and an external fault is determined when the ratio is above the threshold.

17. The apparatus according to claim 16, wherein the instantaneous measurements of the local voltages and local currents are performed for each of three voltage phases.

18. The apparatus according to claim 16, wherein the instantaneous measurements of the local voltages and local currents are performed for both phase-to-phase measurements and phase-to-ground measurements of the local voltages and currents.

19. The apparatus according to claim 16, wherein the computer code that, when run on the processing circuitry, causes the fault detection apparatus to provide a result of the fault detection to a distance protection arrangement for making a trip decision.

20. The apparatus according to claim 16, wherein the transmission line is an ultra high voltage (UHV) transmission line.

* * * * *